(12) United States Patent
Chung

(10) Patent No.: US 8,309,855 B2
(45) Date of Patent: Nov. 13, 2012

(54) FLEXIBLE PRINTED CIRCUIT BOARD

(75) Inventor: Tae Jin Chung, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 475 days.

(21) Appl. No.: 12/481,192

(22) Filed: Jun. 9, 2009

(65) Prior Publication Data

US 2009/0308639 A1  Dec. 17, 2009

(30) Foreign Application Priority Data

Jun. 12, 2008 (KR) ........................ 10-2008-0055229

(51) Int. Cl.
*H05K 1/03* (2006.01)
*H05K 1/00* (2006.01)
*H05K 1/02* (2006.01)

(52) U.S. Cl. ........ 174/256; 174/254; 174/258; 174/259; 361/749; 361/750; 361/751

(58) Field of Classification Search ............. 174/254, 174/256, 258–259; 361/749–751, 748
See application file for complete search history.

(56) References Cited

U.S. PATENT DOCUMENTS

| | | | | |
|---|---|---|---|---|
| 4,704,318 A | * | 11/1987 | Saito et al. | 428/209 |
| 5,569,886 A | * | 10/1996 | Tanabe et al. | 174/260 |
| 5,893,662 A | * | 4/1999 | Ito | 399/110 |
| 6,049,041 A | * | 4/2000 | Yoshioka et al. | 174/117 FF |
| 6,518,503 B1 | * | 2/2003 | Yamanobe et al. | 174/117 FF |
| 6,777,973 B2 | * | 8/2004 | Morishita | 324/754.03 |
| 6,982,394 B2 | | 1/2006 | Ide et al. | |
| 2002/0081444 A1 | * | 6/2002 | Kim | 428/458 |
| 2002/0167786 A1 | | 11/2002 | Sano et al. | |
| 2004/0241465 A1 | * | 12/2004 | Sakayori | 428/458 |
| 2005/0083449 A1 | * | 4/2005 | Morsch | 349/58 |
| 2005/0121299 A1 | * | 6/2005 | Ide et al. | 200/310 |
| 2005/0286854 A1 | * | 12/2005 | Honma et al. | 385/146 |
| 2006/0012991 A1 | * | 1/2006 | Weaver et al. | 362/235 |
| 2006/0225274 A1 | * | 10/2006 | Greenberg et al. | 29/846 |
| 2006/0255711 A1 | * | 11/2006 | Dejima et al. | 313/485 |
| 2007/0074903 A1 | * | 4/2007 | Ide et al. | 174/262 |

(Continued)

FOREIGN PATENT DOCUMENTS

| | | |
|---|---|---|
| CN | 1624842 | 6/2005 |
| KR | 10-2006-0040863 | 5/2006 |

OTHER PUBLICATIONS

The State Intellectual Property Office of P.R. China, The First Office Action, dated Jun. 21, 2012, for Application No. 200910147407.6.

*Primary Examiner* — Timothy Thompson
*Assistant Examiner* — Sherman Ng
(74) *Attorney, Agent, or Firm* — H.C. Park & Associates, PLC

(57) ABSTRACT

A flexible printed circuit board that can be used for mounting a light emitting diode. The flexible printed circuit board includes a lower insulator, an upper insulator, and a conductive pattern disposed between the upper and lower insulators. A white film is attached to the top of the upper insulator. Alternatively, the upper insulator is formed of a white insulation material. The flexible printed circuit board has a planar surface and can be properly assembled to other components.

5 Claims, 2 Drawing Sheets

U.S. PATENT DOCUMENTS

2007/0084710 A1* 4/2007 Koyano et al. ............... 200/341
2007/0121023 A1* 5/2007 Yang ............................. 349/58
2007/0172648 A1* 7/2007 Harai ............................ 428/343
2007/0189042 A1* 8/2007 Pai et al. ...................... 362/632
2007/0279549 A1* 12/2007 Iwasaki ......................... 349/64
2007/0292709 A1* 12/2007 Oishi et al. .................... 428/626

* cited by examiner

FLEXIBLE PRINTED CIRCUIT BOARD

CROSS-REFERENCE TO RELATED APPLICATION

This application claims priority from and the benefit of Korean Patent Application No. 10-2008-0055229, filed on Jun. 12, 2008, which is hereby incorporated by reference for all purposes as if fully set forth herein.

BACKGROUND OF THE INVENTION

1. Field of the Invention

The present invention relates to flexible printed circuit boards and, more particularly, to a flexible printed circuit board for mounting a light emitting diode used as a backlight light source.

2. Discussion of the Background

The flexibility of flexible printed circuit boards enables them to be mounted on various kinds of products, and such flexible printed circuit boards are preferred to other products requiring flexibility in circuit wires, such as mobile phones, notebook PCs, and the like, as they permit circuit wire simplification. For example, since a flexible printed circuit board having a circuit for driving a liquid crystal display device printed thereon can be mounted in a small space, the flexible printed circuit board is commonly used for liquid crystal display devices in various products. Further, a flexible printed circuit board having light emitting diodes mounted thereon manufactured for use as a backlight light source has various applications, such as mobile communication terminals, notebook PCs, and the like.

Generally, the flexible printed circuit board has a conductive pattern between flexible insulators such as polyimide. Such flexible printed circuit boards are classified into single-sided, double-sided, and multilayer flexible printed circuit boards according to a stack structure of conductive patterns.

On the other hand, the light emitting diodes used for the backlight source are mounted on the flexible printed circuit board and are electrically connected to the conductive patterns. The light emitting diodes are disposed along an edge of a light guide plate to emit light toward the light guide plate. However, some of the light emitted from the light emitting diodes is often emitted towards an upper surface of the flexible printed circuit board and absorbed thereby. Further, some of the light having entered the light guide plate is not completely reflected by a bottom surface of the light guide plate, and can be emitted to an outside of the light guide plate therefrom.

In order to solve the problem that light emitted from the light emitting diode is lost by the flexible printed circuit board, a technique has been used to apply a white ink or a photoimageable solder resist (PSR) to the upper surface of the flexible printed circuit board. For example, Korean Patent Laid-open Publication No. 2006-0040863 discloses a technique of printing a white ink on the upper surface of the flexible printed circuit board to enhance transmission efficiency of light emitted from the light emitting diodes.

However, the use of the white ink or PSR entails various problems. First, since it may be difficult to uniformly apply the white ink or PSR to the flexible printed circuit board, the flexible printed circuit board has a high thickness tolerance. As a result, when assembling the flexible printed circuit board to other components, such as the light guide plate and the like, the thickness tolerance of the flexible printed circuit board can cause assembly defects between the components.

Furthermore, when applying and curing the white ink or PSR on the circuit board, a difference in concentration or thickness of the ink on the circuit board can cause generation of bubbles or clumping, thereby causing scratches or cracks during an assembly process or in use, and can also cause yellowing by heat.

SUMMARY OF THE INVENTION

Exemplary embodiments of the present invention provide a flexible printed circuit board that has a light reflection plane on a surface thereof and has a planar surface to reduce a thickness tolerance.

Exemplary embodiments of the present invention also provide a flexible printed circuit board capable of preventing generation of bubbles or clumping, which can be observed when using a white ink or a PSR in a conventional technique.

Exemplary embodiments of the present invention also provide a flexible printed circuit board capable of reducing generation of scratches or cracks during assembly with other components and capable of preventing surface yellowing.

Additional features of the invention will be set forth in the description which follows, and in part will be apparent from the description, or may be learned by practice of the invention.

The present invention discloses a flexible printed circuit board that includes a lower insulator; an upper insulator; a conductive pattern disposed between the upper insulator and the lower insulator; and a white film disposed on a top of the upper insulator.

The present invention also discloses a flexible printed circuit board that includes a lower insulator; a white upper insulator; and a conductive pattern disposed between the white upper insulator and the lower insulator.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
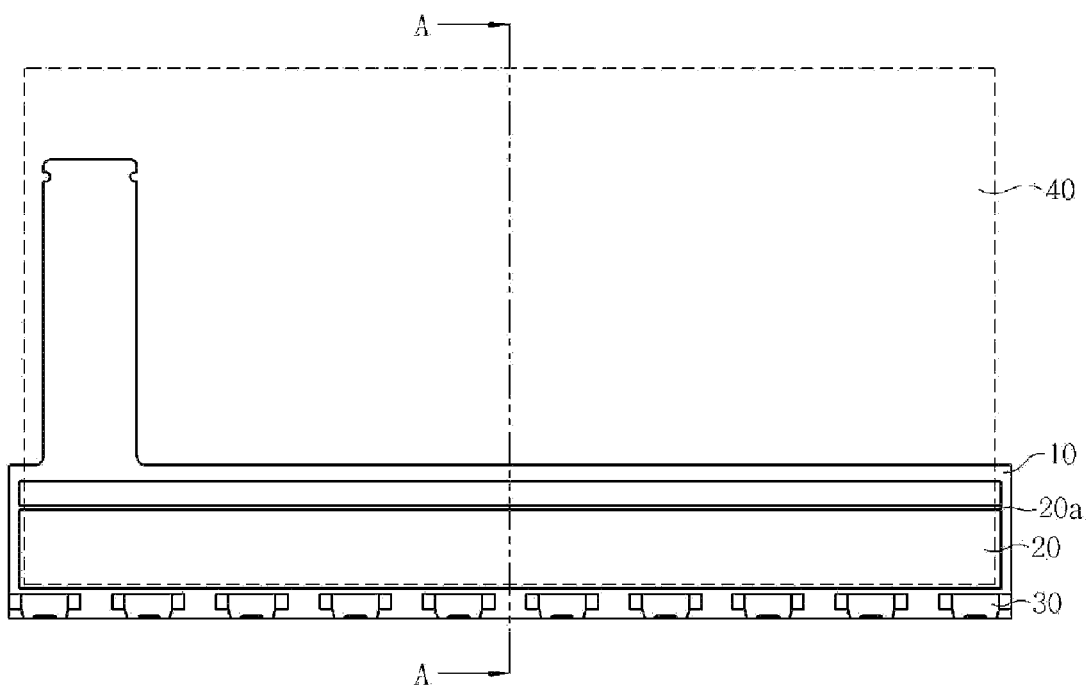
FIG. 1 is a plan view of a flexible printed circuit board according to one exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
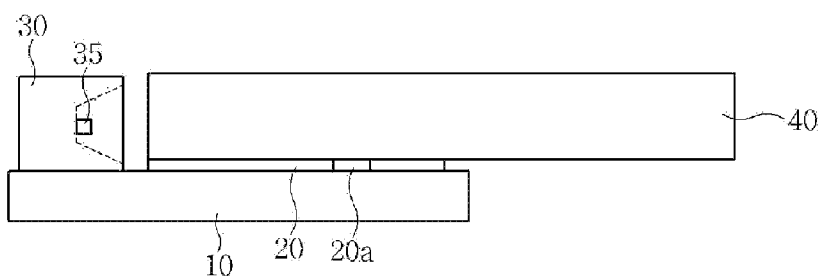
FIG. 2 is a cross-sectional view taken along line A-A of FIG. 1.

FIG. 1 is a plan view of a flexible printed circuit board for mounting a light emitting diode according to one exemplary embodiment of the present invention, and FIG. 2 is a cross-sectional view taken along line A-A of FIG. 1.

Referring to FIGS. 1 and 2, a flexible printed circuit board 10 includes a white film 20 attached to the top thereof and has light emitting diodes 30 mounted thereon. The light emitting diodes 30 are arranged along an edge of a light guide plate 40 to emit light towards one side of the light guide plate 40.

The white film 20 is located under the light guide plate 40 and adjacent to a light entrance part of the light guide plate 40. To facilitate attachment of the light guide plate 40, the white film 20 may be formed with a guide groove 20a. The white film 20 may be one selected from a polyethylene terephthalate (PET) film, a polyethylene naphthalate (PEN) film, and a polyimide (PI) film, which contain a white pigment.

The white film 20 is prepared in a film shape and then attached to the flexible printed circuit board 10. Accordingly, it is possible to reduce a difference in concentration or thickness on the circuit board 10 depending on locations thereof and to prevent generation of bubbles, clumping, and yellowing, which may occur when using a white ink or PSR in a conventional technique.

The light emitting diode 30 includes a light emitting diode chip 35, which is prepared in a package. For example, the light emitting diode 30 may be a side-view light emitting diode package that emits light along a surface of a substrate or circuit board 10 However, it should be understood that the present disclosure is not limited to the side-view light emitting diode package, and that other various light emitting diode packages may be mounted on the flexible printed circuit board 10 to emit light into the light guide plate 40.

The light emitting diode chip 35 may be made of, for example, (Al,In,Ga)N-based or (Al,Ga,In)P-based compound semiconductors, and can emit various colors according to materials thereof. Further, the light emitting diode 30 may contain phosphors capable of converting wavelengths of light emitted from the light emitting diode chip 35, so that the light emitting diode 30 can emit multi-color light, for example, white light.

Light emitted from the light emitting diodes 30 enters the light guide plate 40 through the light entrance part of the light guide plate 40. The white film 20 disposed under the light entrance part of the light guide plate 40 reflects light that is directed toward the flexible printed circuit board 10, thereby preventing optical loss.

In this embodiment, the white film 20 is shown as being disposed under the light entrance part of the light guide plate 40, but the present disclosure is not limited thereto. The white film 20 may be disposed between the light emitting diodes 30 and the light guide plate 40 or between the light emitting diodes 30. With this configuration, the white film 20 prevents light emitted from the light emitting diodes 30 from being absorbed and lost by the flexible printed circuit board 10.

Figure 3:
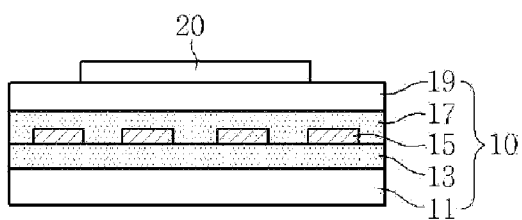
FIG. 3 is an enlarged cross-sectional view of a part of the flexible printed circuit board according to an exemplary embodiment of the present invention.

FIG. 3 is an enlarged cross-sectional view of a part of the flexible printed circuit board 10 according to an embodiment of the present invention.

Referring to FIG. 3, the flexible printed circuit board 10 includes a lower insulator 11, a conductive pattern 15, and an upper insulator 19, where the conductive pattern 15 is disposed between lower insulator 11 and the upper insulator 19. The conductive pattern 15 may be bonded to the lower insulator 11 via a lower-side adhesive 13, and the upper insulator 19 may be bonded to the conductive pattern 15 via an upper-side adhesive 17. The white film 20 described above is attached to the top of the upper insulator 19.

Generally, the conductive pattern 15 is formed by patterning a copper thin film attached to the lower insulator 11, and the upper insulator 19 is attached to the lower insulator 11 having the conductive pattern 15 under pressure and heat. Then, the white film 20 is attached to the top of the upper insulator 19. The white film 20 may be attached thereto before mounting the light emitting diodes 30. Alternatively, the white film 20 may be attached thereto after mounting the light emitting diodes 30. The light emitting diodes 30 are mounted at one side of the upper insulator 19 on the flexible printed circuit board 10 and electrically connected to the conductive pattern 15.

In this embodiment, the flexible printed circuit board 10 is illustrated as having a single-sided flexible printed circuit (FPC) board structure that has a single conductive pattern 15 on the top of the lower insulator 11. However, the present disclosure is not limited thereto. According to another embodiment, the flexible printed circuit board 10 has a double-side FPC structure in which upper and lower sides of the lower insulator 11 are respectively formed with conductive patterns and insulators are attached to the opposite sides of the lower insulator 11. According to an alternative embodiment, the flexible printed circuit board 10 has a multilayer FPC structure in which multiple conductive pattern layers and multiple insulation layers are alternately stacked on top of each other. Here, the white film 20 is attached to the uppermost insulator.

Figure 4:
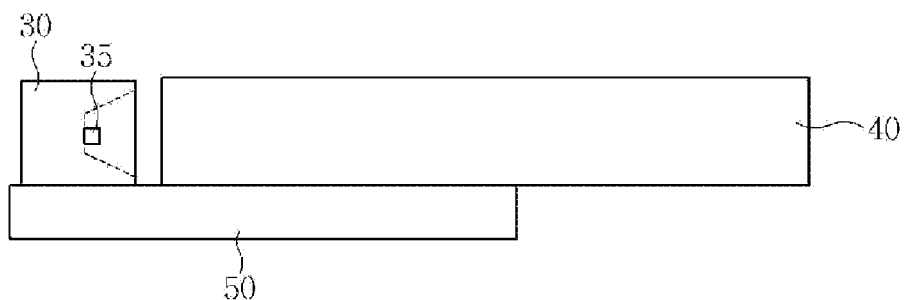
FIG. 4 is a cross-sectional view of a flexible printed circuit board according to another exemplary embodiment of the present invention.
Figure 5:
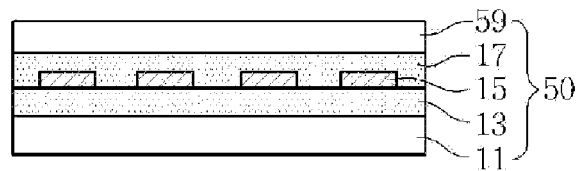
FIG. 5 is an enlarged cross-sectional view of a part of the flexible printed circuit board according to an exemplary embodiment of the present invention.

FIG. 4 is a cross-sectional view of a flexible printed circuit board 50 according to another exemplary embodiment of the present invention, and FIG. 5 is an enlarged cross-sectional view of a part of the flexible printed circuit board 50.

Referring to FIGS. 4 and 5, light emitting diodes 30 and a light guide plate 40 are the same as those described above with reference to FIGS. 1 to 3. The flexible printed circuit board 50 of this embodiment is similar to the flexible printed circuit board 10 described above with reference to FIGS. 1 to 3. However, the flexible printed circuit board 50 includes an upper insulator 59 formed of a white material, which is different from the upper insulator 19 having the white film 20. Although the whole upper insulator 59 may be formed of the white material, the present disclosure is not limited thereto. Alternatively, only a part of the upper insulator may be formed of the white material.

Referring to FIG. 5, the flexible printed circuit board 50 includes a lower insulator 11, a conductive pattern 15, and the upper insulator 59. The conductive pattern 15 may be bonded to the lower insulator 11 via a lower-side adhesive 13, and the white upper insulator 59 may be bonded to the conductive pattern 15 via an upper-side adhesive 17.

The white upper insulator 59 may be one selected from a PET film, a PEN film, and a PI film, which contain a white pigment.

According to this embodiment, since the upper insulator 59 is formed of the white material, it is possible to omit use of a white ink or a PSR, which is conventionally applied to the upper insulator 59 for reflection of light.

The flexible printed circuit board 50 may have a single-sided, double-sided or multilayer FPC structure, and the white upper insulator 59 is formed as the uppermost layer of the flexible printed circuit board 50.

As apparent from the above description, according to one embodiment, the flexible printed circuit board includes a white film attached to the top thereof or a white upper insulator formed of a white material, thereby providing a light reflection plane to the surface of the flexible printed circuit board while guaranteeing that the flexible printed circuit board has a planar surface, thereby reducing thickness tolerance. Therefore, the flexible printed circuit board can prevent generation of bubbles or clumping, reduce generation of scratches or cracks during assembly with other components, and prevent surface yellowing by heat.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flexible printed circuit board, comprising:
a lower insulator;
a white upper insulator;
a conductive pattern disposed between the white upper insulator and the lower insulator; and
an adhesive bonding the white upper insulator to the lower insulator and the conductive pattern,
wherein the white upper insulator is disposed directly on the adhesive, and the adhesive is disposed directly on the conductive pattern.

2. The flexible printed circuit board of claim 1, wherein the white upper insulator comprises one of polyethylene terephthalate (PET), polyethylene naphthalate (PEN), and polyimide (PI), which contain a white pigment.

3. The flexible printed circuit board of claim 1, further comprising: a light emitting diode disposed at one side of the white upper insulator and electrically connected to the conductive pattern.

4. The flexible printed circuit board of claim 1, wherein only part of the white upper insulator comprises one of polyethylene terephthalate (PET), polyethylene naphthalate (PEN), and polyimide (PI), which contain a white pigment.

5. The flexible printed circuit board of claim 1, further comprising light emitting diodes on the white upper insulator such that the light emitting diodes can emit light into a light guide plate arranged on the white upper insulator.

* * * * *